(12) United States Patent
Jankowski

(10) Patent No.: US 12,270,838 B2
(45) Date of Patent: Apr. 8, 2025

(54) CURRENT TRANSDUCER FOR MEASURING THE CURRENT FLOWING THROUGH AN ELECTRICAL CONDUCTOR, AND METHOD FOR OUTPUTTING MEASURED VALUES IN A CURRENT TRANSDUCER WITH OUTPUT OF THE ENERGY FLOW DIRECTION FOR ALTERNATING CURRENTS

(71) Applicant: Phoenix Contact GmbH & Co. KG, Blomberg (DE)

(72) Inventor: Martin Jankowski, Seelze (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 334 days.

(21) Appl. No.: 17/794,630

(22) PCT Filed: Jan. 22, 2021

(86) PCT No.: PCT/EP2021/051419
§ 371 (c)(1),
(2) Date: Feb. 27, 2023

(87) PCT Pub. No.: WO2021/151785
PCT Pub. Date: Aug. 5, 2021

(65) Prior Publication Data
US 2023/0221357 A1 Jul. 13, 2023

(30) Foreign Application Priority Data

Jan. 30, 2020 (LU) ........................ 101628

(51) Int. Cl.
*G01R 21/06* (2006.01)
*G01R 25/00* (2006.01)

(52) U.S. Cl.
CPC ............. *G01R 21/06* (2013.01); *G01R 25/00* (2013.01)

(58) Field of Classification Search
USPC .................................... 324/86, 117 H, 117 R
See application file for complete search history.

(56) References Cited

U.S. PATENT DOCUMENTS

2009/0315566 A1  12/2009  Soren
2016/0091538 A1   3/2016  Ishihara et al.

FOREIGN PATENT DOCUMENTS

CN    110224491 A    9/2019
DE      837563 C    4/1952
(Continued)

OTHER PUBLICATIONS

Wikipedia, "Blindleistung", Feb. 23, 2018 (Feb. 23, 2018), Retrieved from the Internet: URL:https://de.wikipedia.org/w/index.php?title=Blindleistung&oldid=174302273 XP055493525 [retrieved on Jul. 18, 2018], p. 2-p. 3.

(Continued)

*Primary Examiner* — Vincent Q Nguyen
(74) *Attorney, Agent, or Firm* — LEYDIG, VOIT & MAYER, LTD.

(57) ABSTRACT

A current transducer for measuring the current flowing through an electrical conductor includes a current sensor for detecting a current intensity through the electrical conductor and an evaluation device for evaluating measured values detected by the current sensor and determining an energy flow direction as a determined energy flow direction. The current intensity is output in a positive or negative output range of an output unit depending on the determined energy flow direction.

15 Claims, 5 Drawing Sheets

(56) References Cited

FOREIGN PATENT DOCUMENTS

| DE | 112014002840 T5 | 3/2016 |
|---|---|---|
| EP | 3252907 A1 | 12/2017 |

OTHER PUBLICATIONS

Kamber W, "Scheinleistungszähler", *BULL. SEV/VSE,*, vol. 66, No. 24, Dec. 20, 1975 (Dec. 20, 1975), p. 1341-1346, XP001457184.
Paul Koenig, "Eine Methode zur Messung des Leistungsfaktors in Bahnnetzen", *Techn. Mitt. Aeg-Telefunken*, ,vol. 64, No. 7, Jan. 1, 1974 (Jan. 1, 1974), p. 257-259, XP001456616.

CURRENT TRANSDUCER FOR MEASURING THE CURRENT FLOWING THROUGH AN ELECTRICAL CONDUCTOR, AND METHOD FOR OUTPUTTING MEASURED VALUES IN A CURRENT TRANSDUCER WITH OUTPUT OF THE ENERGY FLOW DIRECTION FOR ALTERNATING CURRENTS

CROSS-REFERENCE TO PRIOR APPLICATIONS

This application is a U.S. National Phase application under 35 U.S.C. § 371 of International Application No. PCT/EP2021/051419, filed on Jan. 22, 2021, and claims benefit to Luxembourg Patent Application No. LU 101628, filed on Jan. 30, 2020. The International Application was published in German on Aug. 5, 2021 as WO/2021/151785 under PCT Article 21(2).

FIELD

The invention relates to a current transducer for measuring the current flowing through an electrical conductor. The disclosure further relates to a method of outputting measured values in a current transducer with output of the energy flow direction for alternating currents.

BACKGROUND

In known current transducers for alternating currents, typically only the value of the current intensity is output proportionally.

There are energy meters that can determine the direction of the energy flow and also display it, but cannot output the proportional current.

Document US2009315566A1 relates to an AC current sensor that produces a pulsed output signal that can be used to indicate both phase angle and polarity, from which the energy flow direction can also be determined. The current intensity is indicated by a lamp (LED) by triggering it with the generated pulses. A brighter glow then indicates a stronger current flow. In one embodiment, the energy flow direction is also digitally output and displayed. This sensor can thus provide an indication as to the energy flow direction relative to the current sensor at which e.g. a questionable short circuit has occurred, because the direction indication provided herewith is registered in the measuring time span provided shortly before the short circuit.

However, the known solution has the disadvantage that current intensity and energy flow direction cannot be given in this manner to a control unit in order to control a machine or a process.

SUMMARY

In an embodiment, the present invention provides a current transducer for measuring the current flowing through an electrical conductor, comprising: a current sensor configured to detect a current intensity through the electrical conductor; and an evaluation device configured to evaluate measured values detected by the current sensor and to determine an energy flow direction as a determined energy flow direction, wherein the current intensity is output in a positive or negative output range of an output unit depending on the determined energy flow direction.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
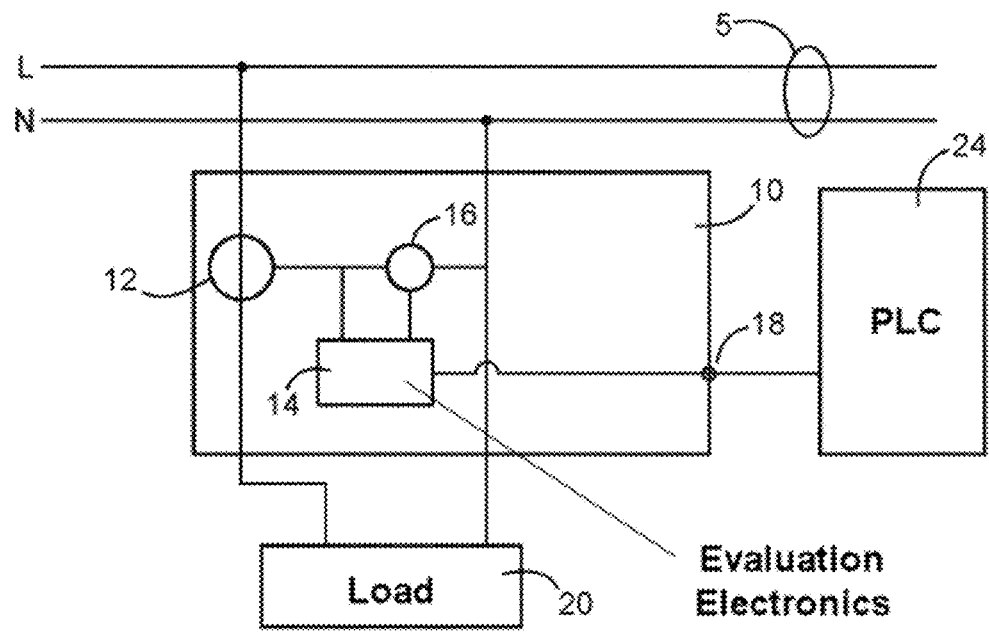
FIG. 1 shows a first block diagram of a current transducer for measuring the current flowing through an electrical conductor.

In an embodiment, the present invention provides an improved current transducer that avoids these disadvantages. This was recognised in the context of the invention.

The invention describes a current transducer having an input at which a primary alternating current can be measured. A suitable current sensor is installed for this purpose. In addition, the current transducer contains a suitable energy flow direction detection means, which allows the current direction of the primary alternating current to be detected (or sensed). A suitable processing unit combines an analogue output signal from the level of the primary alternating current and the energy flow direction, which can assume both positive and negative values.

The current transducer according to the invention includes a current sensor which detects the current intensity through the electrical conductor and an evaluation device for evaluating the measured values detected by the current sensor and for determining the energy flow direction. Depending on the determined energy flow direction, the current transducer according to the invention outputs the current intensity in a positive or negative output current. Compared to the known current transducers, there is the advantage that the energy flow direction is also detected and an output is created in such a way that energy flow direction and current intensity are output simultaneously. A control unit can detect this output signal and control or regulate the machine or the process accordingly.

Advantageously, the current transducer further comprises a voltmeter, wherein the voltmeter detects the voltage level of the voltage on the electrical conductor to determine the phase position. It is then advantageous if the determination of the energy flow direction is carried out by evaluating the measured values of current and voltage on the conductor by the evaluation device in such a way that a phase shift angle determination is carried out for the phase shift between voltage and current. This then generates an output signal in which the current intensity is output in the positive output range if the phase shift angle is in the range of −90° to +90° and otherwise the current intensity is output in the negative output range. By determining the phase shift angle, the energy flow direction can be easily determined.

In a preferred embodiment of the current transducer, the output of the current intensity in the positive and negative output range is proportional, wherein the respective output range is defined in such a way that the output current passes through the zero point in proportion to the measuring current.

The evaluation device can thereby generate the output signal for the detected measuring current in such a way that the output values can be output signed along the ordinate in accordance with the determined energy flow direction. The output signal can correspond to an analogue DC signal. The energy flow direction thereby determines the direction of the current.

In another variant, the output of the measuring current is always positive, i.e. with the same current direction, and the energy flow direction is output via another output terminal.

In this variant, it can additionally be provided that the output of the measuring current is always positive and the energy flow direction is output via the further output terminal and the output signal additionally comprises an offset value. In a preferred example, this can be 4 mA.

For better information of the operating staff, it is advantageous if the current transducer is equipped with two additional display elements, in particular light-emitting diodes, which are used to indicate the energy flow direction.

In another embodiment, the invention comprises a method for outputting measured values in a current transducer in which, in addition to the current intensity, the energy flow direction of the alternating current flowing through the electrical conductor is measured, and the current intensity is output in a positive or negative output range of an output unit depending on the determined energy flow direction.

For this purpose, it is advantageous if a measurement is carried out of the voltage level of the voltage on the electrical conductor and the determination of the energy flow direction is carried out by evaluating the measured values of current and voltage, wherein a phase shift angle determination is carried out for the phase shift between voltage and current and the current intensity is output in the positive output range if the phase shift angle is in the range of 90° to +90°, and otherwise the current intensity is output in the negative output range.

If the measured primary current is to be output without the polarity switching at the output, the polarity can be output by another output.

The standard current can be 0-20 mA or 4-20 mA.

It is also advantageous if, in addition to the current measurement, the voltage level of the voltage on the electrical conductor is measured and the apparent power S can be determined via S=U.I. This can then be output proportionally to the measurement of the current. With the determined phase shift angle φ, it is also possible to determine and output the active and reactive power via the determined active factor cos φ and the determined reactive factor sin φ. The formula for the active power P is P=S.cos φ and the formula for the reactive power QL is QL=S.sin φ. Different variants are mentioned for this. An analogue output of a microcontroller is thereby used as the output unit, via which a standard current in the range of e.g. 0-20 mA is output, or a standard voltage in the range of e.g. −10 V . . . +10 V or 0-10 V is output.

In one variant, the current is measured by the current transducer and the voltage is measured with a voltmeter, wherein instead of the output of the measured current, an output in the form of a voltage proportional to the measured current occurs.

In another variant, the current is again measured by the current transducer and the voltage is measured with a voltmeter, wherein instead of the current intensity, the specific active power is output in the positive and negative output range of the output unit.

In the next variant, the current is again measured by the current transducer and the voltage is measured with a voltmeter, wherein instead of the current intensity, the specific reactive power is output in the positive and negative output range of the output unit.

In another variant, the current is again measured by the current transducer and the voltage is measured with a voltmeter, wherein instead of the current intensity, the specific apparent power is output in the positive output range of the output unit.

In another variant, the current is again measured by the current transducer and the voltage is measured with a voltmeter, wherein instead of the current intensity, the specific power factor or the specific phase shift angle is output in the positive and negative output range of the output unit.

In another variant, the current is again measured by the current transducer and instead of the current intensity, the specific frequency is output in the positive output range of the output unit.

It is evident that the highest power factor or the highest frequency to be measured corresponds to the highest current to be output, e.g. 20 mA, or corresponds to the highest voltage to be output, e.g. 10 V.

This also applies to the phase shift angle in the same way, except that the phase shift angle is also output signed.

The present description illustrates the principles of the disclosure according to the invention. It is thus evident that persons skilled in the art will be able to design various arrangements which, although not explicitly described herein, embody principles of the disclosure according to the invention and are also intended to be protected in their scope.

FIG. 1 shows a block diagram of a current transducer 10 for measuring the current flowing through an electrical conductor L. Shown is a single-phase cable 5 consisting of phase L and neutral conductor N. Optionally, a protective conductor can also be included in the cable 5. The current on the conductor L is to be monitored. A current transducer 10 is used for this purpose. The latter is connected between phase L and neutral conductor N. In this variant, the current is passed internally through the current transducer 10. In another type of current transducer, the current is not passed through the current transducer, but is determined indirectly. For this purpose, a current transducer 10 with a Rogowski coil can be used, for example. This is an air coil that is placed around the conductor L. The effect of the changing magnetic field that is formed around the conductor L in alternating current is such that a voltage is induced in the Rogowski coil which is measured.

In the current transducer 10 shown, the reference numeral 12 denotes a current sensor. The latter detects the current flowing through the conductor L quantitatively. The current transducer 10 is also connected to the neutral conductor N.

Both conductors, phase L and neutral conductor N, are led out again at outputs to which the load 20 is connected. Typical current sensors, often also referred to as current transformers, are low-power transformers that transform high currents into easily measurable values. In one variant, the input winding is connected into the conductor of phase L and the current to be measured flows through it. A conventional ammeter (ampere meter), for example, is connected to the output winding. Due to the fact that the primary winding has only a few turns or even only one turn, whereas the secondary winding has a much larger number of turns, high currents of several hundred amperes can be detected with conventional measuring technology (ampere meters). Another variant of current sensors are so-called push-through current transformers, through which the conductor whose current is to be detected is inserted. This also includes the Rogowski coils. This allows even higher currents to be detected. This is advantageous for conductors that relate, e.g., to conductor rails, but which can no longer be wound with little effort. A third variant of current sensors 12, which can also be used in the device described, are Hall effect current sensors. These exploit the Hall effect, which consists of generating an electrical voltage in a current-carrying conductor that is in a stationary magnetic field. Such Hall generators are typically flat in design, wherein a magnetic field is generated that is as homogeneous as possible and aligned perpendicular to the flat conductor. The Hall voltage is tapped at the outer edges of the flat conductor transverse to the direction of current. In one variant, the Hall-effect current sensor is inserted into a slotted magnetic toroidal core.

The measured values are detected by the evaluation electronics 14 of the device and temporarily stored for evaluation. The evaluation electronics 14 can be designed as a microcontroller. The latter is equipped with an A/D converter and scanning unit to detect successive measured values. It also contains a memory (e.g. CMOS RAM memory) to temporarily store the measured values. The main component is a microcomputer, which is programmable and executes the evaluation algorithm. The microcomputer also contains a D/A converter unit, which generates an analogue output signal. The output unit is thus preferably realised by an integrated D/A converter unit in a microcomputer. The analogue output signal is output via the output terminal 18. A separate line can be connected to this output terminal 18 and passes this signal to a control device 24. For example, the signal can be routed to a programmable logic controller PLC 24. The measured values are detected at a specific scanning rate, which can be in the range of kS/s. What is also detected by the evaluation electronics 14 is the voltage between phase L and neutral conductor N. For this purpose, a voltmeter 16 is connected to phase L and neutral conductor N. The measured voltage values are picked up by the evaluation electronics 14 and written into the memory.

Figure 2:
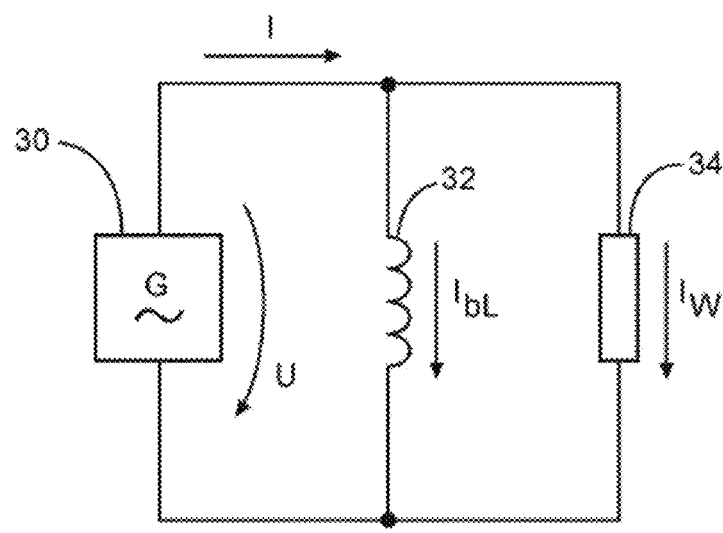
FIG. 2 shows a circuit diagram explaining the behaviour of an alternating current in the presence of an inductor.

The energy flow direction is also determined by the current transducer 10. This is done by determining the phase position of the current relative to the voltage. To illustrate the measuring principle, a circuit is shown in FIG. 2. The alternator has the reference numeral 30. The current flow I is shown in one direction. In the circuit shown, the load 20 consists of a coil 32 and an ohmic resistor 34. The current I is divided accordingly into a portion Ibl. and a portion Iw. As known, the coil 32 acts like a reactive resistance, but leads to a phase shift between voltage U and current I.

Figure 3:
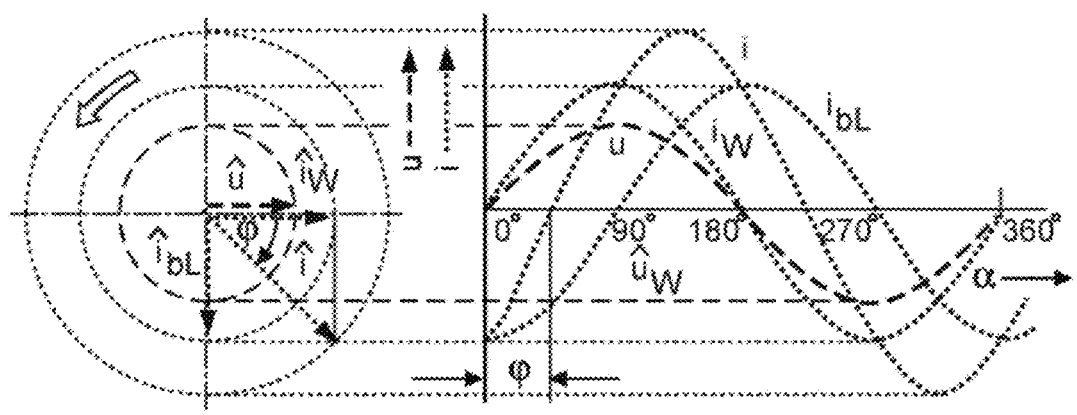
FIG. 3 shows a signal diagram with the current curves at the active and reactive resistance and the voltage curve in the circuitry according to FIG. 2.

The exact signal characteristics are shown in FIG. 3. The vector diagram is shown on the left side and the signal curves on the right side. The peak values of voltage û, current îbl through the coil 32 and current îw through the ohmic resistor 34 are shown in the vector diagram as the corresponding vector lengths. This results in the superposition of the total current i, whose signal curve can also be seen. The phase difference φ between voltage u and current i is shown in both parts of FIG. 3. The specific wiring results in a phase difference φ of approx. 40°. The phase difference φ can be determined in such a way that the signal curves of u and i are evaluated. In both cases, the ascending zero crossing of the signal curves of u and i is determined. The difference in time is then related to the period T to determine the phase difference φ.

The direction of the energy flow is thereby as follows: When the phase difference between u and i is 90° and +90°, the energy flow direction is defined as positive, i.e. from the generator 30 to the load 20. In the other cases it is defined negatively, i.e. from the load 20 to the generator 30.

Figure 4:
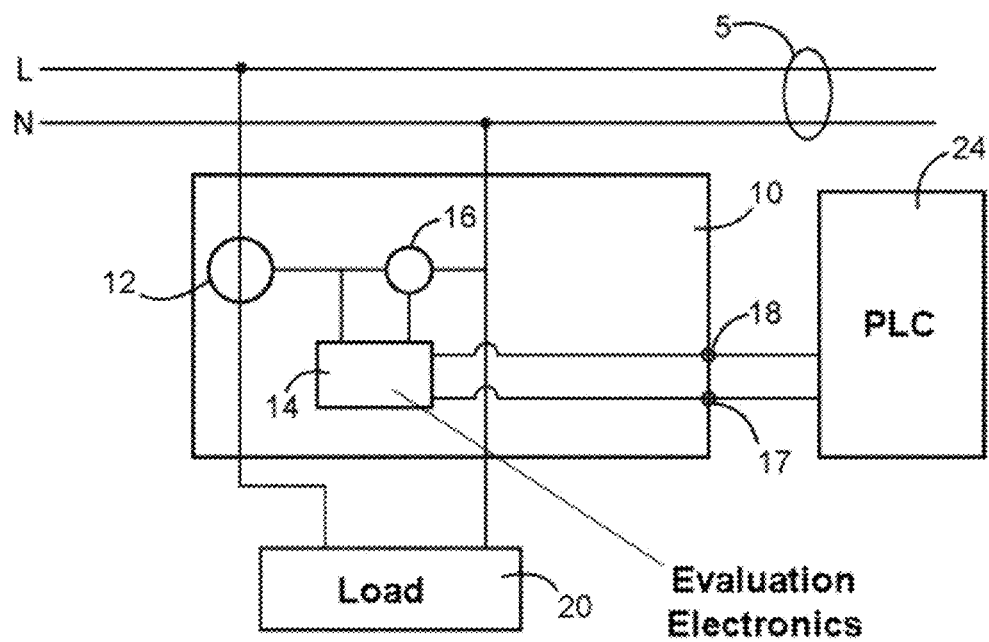
FIG. 4 shows a second block diagram of a current transducer for measuring the current flowing through an electrical conductor.

FIG. 4 shows a second variant of the current transducer 10. The same reference numerals denote the same components. One difference is that two output lines are led out of the current transducer 10. The one output line leads to the output terminal 18. The other output line leads to output terminal 17. The line at output terminal 18 is again connected to a D/A output of the microcomputer. The other output line to the output terminal 17 can also be connected to a D/A output of the microcomputer. In another variant, the output line can alternatively be connected to a digital output of the microcomputer. Thus, two output lines lead to the control device 24.

Figure 5:
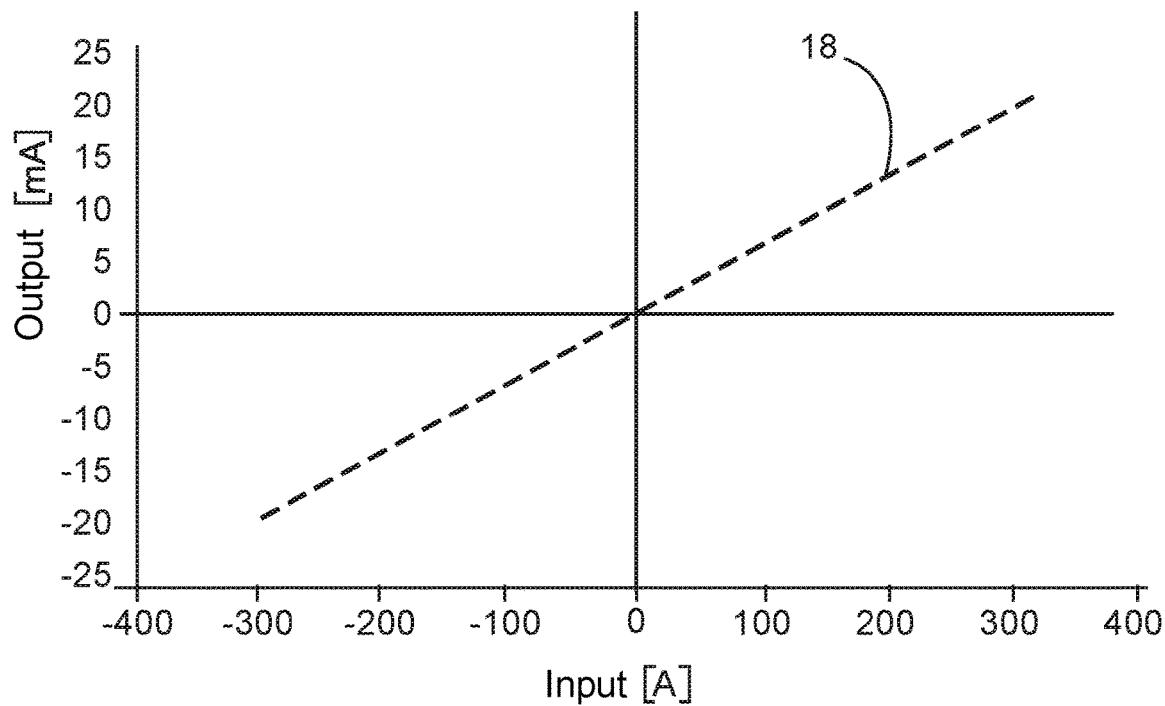
FIG. 5 shows a first exemplary embodiment of an output of current intensity and energy flow direction in analogue form in the current transducer according to the invention.

FIG. 5 now shows a combined variant of an analogue output of the measured current intensity and the energy flow direction. The analogue output signal is shown in the form of a secondary current to primary current diagram. The primary current corresponds to the current through conductor L and is specified from −400 A to +400 A in FIG. 5. The secondary current is the current measured in the evaluation device 14 and is in the range of −25 mA to +25 mA. In the case shown, a peak value of approx. 20 mA results. This value corresponds to a primary current of approx. 300 A. The conversion is directly proportional. The current intensity is output in analogue form, as shown, taking into account the energy flow direction. Therefore, if the energy flow direction is determined to be positive, the output is in the form of the straight lines in the first quadrant of the coordinate system. A direct current is output. Its current flow is thus in the direction from the evaluation electronics 14 to the control system 24. Conversely, if the energy flow direction was determined to be negative, the output is in the form of the straight lines shown in the third quadrant of the coordinate system. The current flow is then in the reverse direction from the control system 24 to the evaluation electronics 14. FIG. 5 shows both straight lines in the form of a continuous line.

Figure 6:
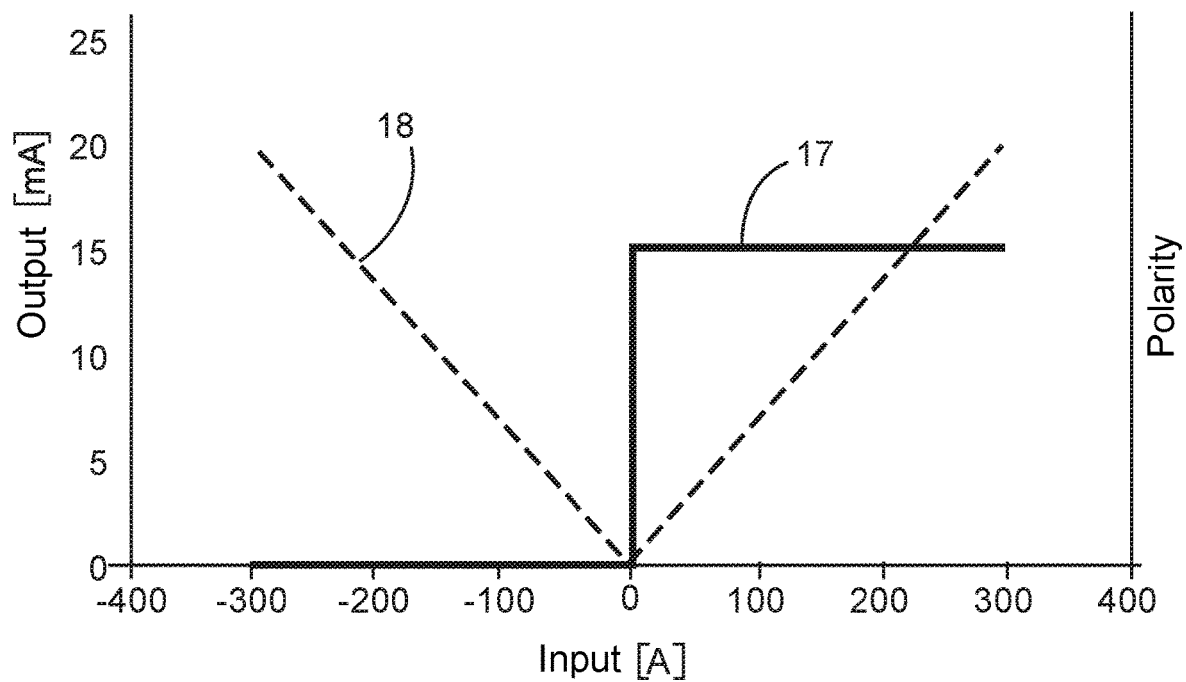
FIG. 6 shows a second exemplary embodiment of an output of current intensity and energy flow direction in analogue form in the current transducer according to the invention.

FIG. 6 shows a second variant of the output of the measured current intensity and the energy flow direction, which is valid for the variant of the current transducer 10 according to FIG. 4. In this case, the direction of the energy flow is only indicated by the fact that the additional output 17 takes on a different state for the positive range than for the negative state. For the secondary current, a signal with positive polarity is output in both cases, i.e. the current direction remains the same.

Figure 7:
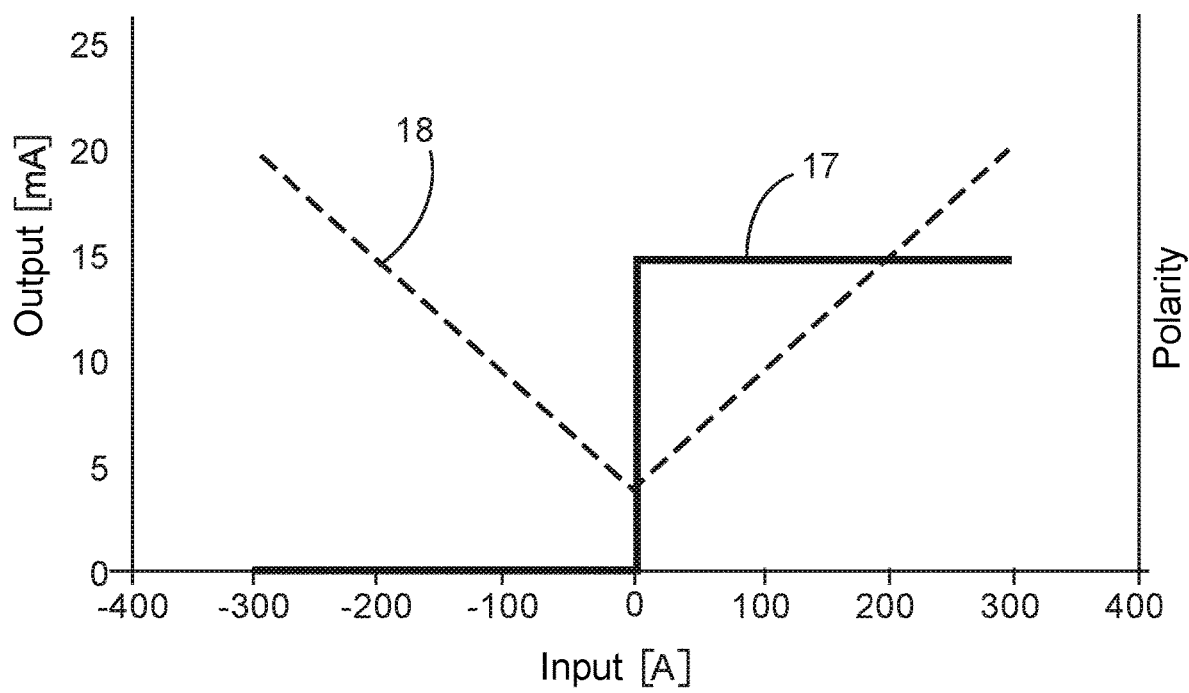
FIG. 7 shows a third exemplary embodiment of an output of current intensity and energy flow direction in analogue form in the current transducer according to the invention.

FIG. 7 shows a third exemplary embodiment of the analogue output of the measured current intensity and the energy flow direction. The energy flow direction is thereby shown as in FIG. 6. Positive values are also shown for the current intensity of the secondary current in both cases.

However, the straight lines do not start from the origin of the coordinate system. Instead, it is shown that there is a certain offset of approx. 4 mA. The straight lines run from this offset point at 0 A primary current to the currently measured peak value î. This form of output of the measuring current enables a secondary current flow, although no primary current is flowing. This allows the measuring system itself to be monitored without primary current. The switching signal for outputting the polarity is also shown again.

Figure 8:
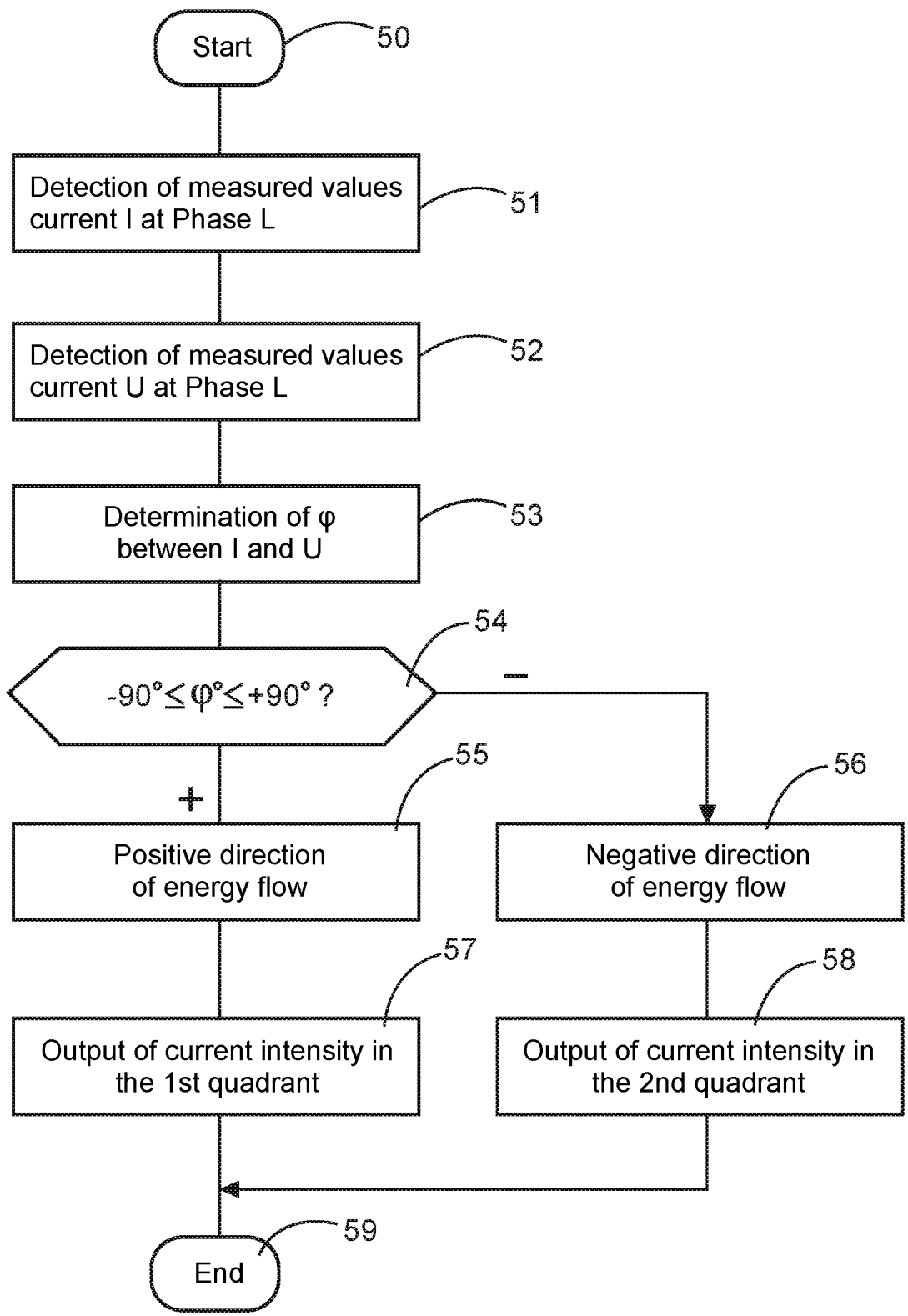
FIG. 8 shows a flow chart for an evaluation algorithm to determine the energy flow direction and to prepare the data for an analogue output of current intensity and energy flow direction.

FIG. 8 shows an exemplary embodiment of a flow chart of an evaluation algorithm that is processed in the evaluation electronics 14. The program start is denoted with the reference numeral 50. In program step 51, the measured value of the current through the conductor of phase L is detected. In program step 52, the measured value of the voltage on the conductor of phase L in relation to the neutral conductor is detected. In this case, the signals output by the current sensor 12 are sent to an A/D input of the microcontroller of the evaluation electronics 14. Said A/D input scans the input signal and writes the digital values into the memory. Likewise, the measuring signal of the voltmeter is scanned via another A/D input of the microcontroller and the digital values are also written into the memory. In program step 53, the phase difference φ between voltage U and current I is determined. The determination is made as described above in connection with FIG. 3. The signal curves of U and I are evaluated. In one variant, the ascending zero crossing of the signal curves of U and I is determined for both signals. Then the time difference between these two points is determined. This is then set in relation to the specific period T of the signals to determine the phase difference φ. In the presence of inductors, the alternating current follows the alternating voltage. In program step 54, the evaluation of the determined phase shift angle φ takes place. If φ is in the range of [90°, +90°], it is concluded that the energy flow direction is positive, i.e. energy flows from the alternator 12 towards the load 20. If the phase shift angle φ is found to be outside this range, it is concluded that the energy flow direction is reversed, i.e. the load supplies the energy and the latter flows back to the power plant. In program step 55, it is determined that the energy flow direction is positive. Then, in program step 57, the output current intensity is output depending on the input current intensity with the straight line as shown in the 1st quadrant of FIG. 5, FIG. 6 or FIG. 7. The energy flow direction is thus also shown. In addition, the switching signal shown in FIGS. 6 and 7 is output. If the phase shift angle φ is outside the range of [−90°, +90°], the energy flow direction is determined to be negative in program step 56. Accordingly, in program step 58, the output current intensity is output with the straight line as in the 3rd quadrant of FIG. 5, or in the 2nd quadrant of FIG. 6 or 7. In turn, the switching signal at the output terminal 17 can also be output.

It should be evident that the proposed method and associated devices may be implemented in various forms of hardware, software, firmware, special processors, or a combination thereof. In a preferred variant, microcontrollers with integrated RAM memory and integrated I/O interfaces are used. Special processors may comprise application-specific integrated circuits (ASICs), reduced instruction set computers (RISC) and/or field programmable gate arrays (FPGAs). Preferably, the proposed method and device is implemented as a combination of hardware and software. The software is preferably installed as an application program on a program storage device. Typically, it is a machine based on a computer platform comprising hardware such as one or more central processing units (CPU), random access memory (RAM) and one or more input/output (I/O) interface(s). An operating system is also typically installed on the computer platform. The various processes and functions described here may be part of the application program or a part that is executed via the operating system.

The disclosure is not limited to the exemplary embodiments described herein. There is room for various adaptations and modifications that the person skilled in the art would consider based on their expertise as also appertaining to the disclosure.

In the following table, some possibilities are compiled for different variants of input measurement and output options for the current transducer according to the invention. The output options are thereby listed separately according to analogue and digital options in different columns.

Table 1 should be understood to mean that all input measurement options can be linked to the analogue and digital output options as desired. It can therefore be selected for an input measurement option whether it should be provided in the form of an analogue current output or an analogue voltage output for the control system.

Different output ranges can be selected thereby, e.g. 4 to 20 mA for the current output or 1 to 5 V for the voltage output. With the digital output options, the information given in the table can be output, e.g. via correspondingly controlled LEDs. The abbreviation THD thereby stands for total harmonic distortion, which in the context of signal analysis corresponds to a specification to quantify the size of the portions that result from non-linear distortions of a signal.

TABLE 1

| Input measurement options RMS value of the AC current intensity | Analogue output options for current output | Digital output options Polarity of the energy flow direction |
|---|---|---|
| RMS value of the AC voltage | 0 to 20 mA | Polarity of the line factor |
| Active power | 4 to 20 mA | Polarity of the deviation from the setpoint value |
| Reactive power | −20 to +20 mA | Load type (inductive/capacitive) |
| Apparent power | for voltage output | |
| Power factor | 0 to 10 V | |
| Frequency | 2 to 10 V | |
| Crest factor | −10 to +10 V | |
| THD current | 0 to 5 V | |
| THD voltage | 1 to 5 V | |
| Direct current | −5 to +5 V | |
| DC voltage | 0 to 10 V | |
| Load type (inductive/capacitive) | 2 to 10 V | |
| Phase angle | | |
| Deviation from the setpoint value of one of the aforementioned variables | | |

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

AC line 5
Current transducer 10
Current sensor 12
Evaluation electronics 14
Voltmeter 16
1. Output terminal 17
2. Output terminal 18
AC load 20
Control device 24
Alternator 30
Coil 32
Resistor 34
Different program steps of a computer program 50-59
Phase L
Neutral conductor N
Current I
Voltage U
Reactive current IbL
Active current Iw
Peak value total current $\hat{i}$
Peak value reactive current $\hat{i}bL$
Peak value active current $\hat{i}w$
Peak value voltage $\hat{u}$
Phase angle $\alpha$
Phase shift angle $\varphi$

The invention claimed is:

1. A current transducer for measuring the current flowing through an electrical conductor, comprising: a current sensor configured to detect a current intensity through the electrical conductor; an evaluation device configured to evaluate measured values detected by the current sensor and to determine an energy flow direction as a determined energy flow direction; a voltmeter configured to detect a voltage on the electrical conductor as a measured value of the voltage, wherein the current intensity is output in a positive or negative output range of an output unit depending on the determined energy flow direction, wherein the determination of the energy flow direction is carried out by evaluating the measured values of current and voltage such that a phase shift angle determination is carried out for a phase shift between voltage and current, and wherein the current intensity is output in the positive output range if the phase shift angle is in a range of $-90°$ to $+90°$ and otherwise the current intensity is output in the negative output range.

2. The current transducer of claim 1, wherein the current intensity in the positive and negative output range is proportionally output, and wherein a respective output range is defined such that the output current passes through a zero point in proportion to the measuring current.

3. The current transducer of claim 2, wherein the evaluation device is configured to generate an output signal for the detected measuring current such that the current transducer is configured to output the output values signed along an ordinate in accordance with the determined energy flow direction.

4. The current transducer of claim 1, wherein an output of the measuring current is always positive, and
wherein the current transducer is configured to output the energy flow direction via another output terminal.

5. The current transducer of claim 4, wherein the output of the measuring current is always positive and the energy flow direction is outputtable via the other output terminal and the output signal comprises an offset value of 4 mA.

6. The current transducer of claim 1, further comprising one or two additional display elements comprising light-emitting diodes, which are configured to indicate the energy flow direction.

7. The current transducer of claim 1, wherein the currentintensity comprises a voltage proportional to the current intensity.

8. A method of outputting measured values by a transducer, comprising:
detecting, by a current sensor, a current intensity through an electrical conductor;
evaluating, by an evaluation device, measured values detected by the current sensor to determine an energy flow direction as a determined energy flow direction;
wherein the current intensity is output in a positive or negative output range of an output unit depending on the determined energy flow direction;
measuring the energy flow direction of the alternating current flowing through the electrical conductor in addition to the current intensity; and
outputting the measured current intensity in a positive or negative output range of the output unit depending on the determined energy flow direction.

9. The method of claim 8, wherein a measurement is carried out of a voltage level of the voltage on the electrical conductor and the determination of the energy flow direction is carried out by evaluating measured values of current and voltage, and
wherein a phase shift angle determination is carried out for a phase shift between voltage and current, and the measured current intensity is output in the positive output range if the phase shift angle is in the range of $90°$ to $+90°$, and otherwise the current intensity is output in the negative output range.

10. The method of claim 9, wherein an active power is determined as a measured active power, and the measured active power is output in the positive and negative output range instead of the measured current intensity.

11. The method of claim 9, wherein a reactive power is determined as a measured reactive power, and the measured reactive power is output in the positive and negative output range instead of the measured current intensity.

12. The method of claim 9, wherein an apparent power is determined as a measured apparent power, and the measured apparent power is output in the positive output range instead of the measured current intensity.

13. The method of claim 9, wherein a power factor is determined as a measured power factor, and instead of the measured current intensity, the measured power factor or a measured phase shift angle is output in the positive and negative output range.

14. The method of claim 8, wherein a frequency of the alternating current is measured as a measured frequency, and instead of the measured current intensity, the measured frequency is output in the positive output range.

15. A current transducer for measuring the current flowing through an electrical conductor, comprising:
- a current sensor configured to detect a current intensity through the electrical conductor; and
- an evaluation device configured to evaluate measured values detected by the current sensor and to determine an energy flow direction as a determined energy flow direction,
- wherein the current intensity is output in a positive or negative output range of an output unit depending on the determined energy flow direction,
- wherein the current intensity in the positive and negative output range is proportionally output,
- wherein a respective output range is defined such that the output current passes through a zero point in proportion to the measuring current, and
- wherein the evaluation device is configured to generate an output signal for the detected measuring current such that the current transducer is configured to output the output values signed along an ordinate in accordance with the determined energy flow direction.

\* \* \* \* \*